(12) United States Patent
Kiesel et al.

(10) Patent No.: US 9,414,515 B2
(45) Date of Patent: Aug. 9, 2016

(54) ELECTRICAL DEVICE

(75) Inventors: Michael Kiesel, Deutschland (DE);
Ronny Enenkel, Deutschland (DE);
Alexander Junginger, Deutschland (DE)

(73) Assignee: SEW-EURODRIVE GMBH & CO. KG, Bruchsal (DE)

( * ) Notice: Subject to any disclaimer, the term of this patent is extended or adjusted under 35 U.S.C. 154(b) by 620 days.

(21) Appl. No.: 13/503,618

(22) PCT Filed: Sep. 28, 2010

(86) PCT No.: PCT/EP2010/005899
§ 371 (c)(1),
(2), (4) Date: Apr. 23, 2012

(87) PCT Pub. No.: WO2011/047772
PCT Pub. Date: Apr. 28, 2011

(65) Prior Publication Data
US 2012/0210037 A1      Aug. 16, 2012

(30) Foreign Application Priority Data

Oct. 21, 2009   (DE) .................... 10 2009 050 232

(51) Int. Cl.
*G06F 13/14* (2006.01)
*H01R 9/22* (2006.01)
(Continued)

(52) U.S. Cl.
CPC ............... *H05K 7/1472* (2013.01); *H01R 9/22* (2013.01); *H01R 13/405* (2013.01); *H05K 7/1468* (2013.01); *H05K 7/1477* (2013.01); *H05K 7/1484* (2013.01); *H02G 3/08* (2013.01)

(58) Field of Classification Search
CPC .......... H05K 7/02; H01R 9/22; H01R 13/405; H02G 3/08; G06F 13/14
USPC ........................................................ 710/305
See application file for complete search history.

(56) References Cited

U.S. PATENT DOCUMENTS

| 6,790,050 | B1 | 9/2004 | Roth-Stielow et al. |
| 2005/0195565 | A1* | 9/2005 | Bright ........................... 361/688 |

(Continued)

FOREIGN PATENT DOCUMENTS

| DE | 10 2004 034 834 | 3/2006 |
| EP | 1 895 642 | 3/2008 |
| WO | 00/48438 | 8/2000 |

OTHER PUBLICATIONS

International Search Report, issued in corresponding International Application No. PCT/EP2010/005899.

(Continued)

*Primary Examiner* — Henry Tsai
*Assistant Examiner* — Christopher a Daley
(74) *Attorney, Agent, or Firm* — Kenyon & Kenyon LLP

(57) ABSTRACT

An electrical device, which is assembled from modules or includes assembled modules, the modules each including an electronic circuit mounted on a respective heat sink, the modules being configured as nodes of a system bus that also leads to an electronic circuit designed as a node of the system bus, the electronic circuit being configured in a lower part that is configured in a recess of the housing of the electrical device; an upper part being detachably connectable to the lower part; a memory element being configured in the upper part; and data lines for reading out the memory element via the electronic circuit being routed via a plug connection to the electronic circuit.

6 Claims, 3 Drawing Sheets

Figure 1:
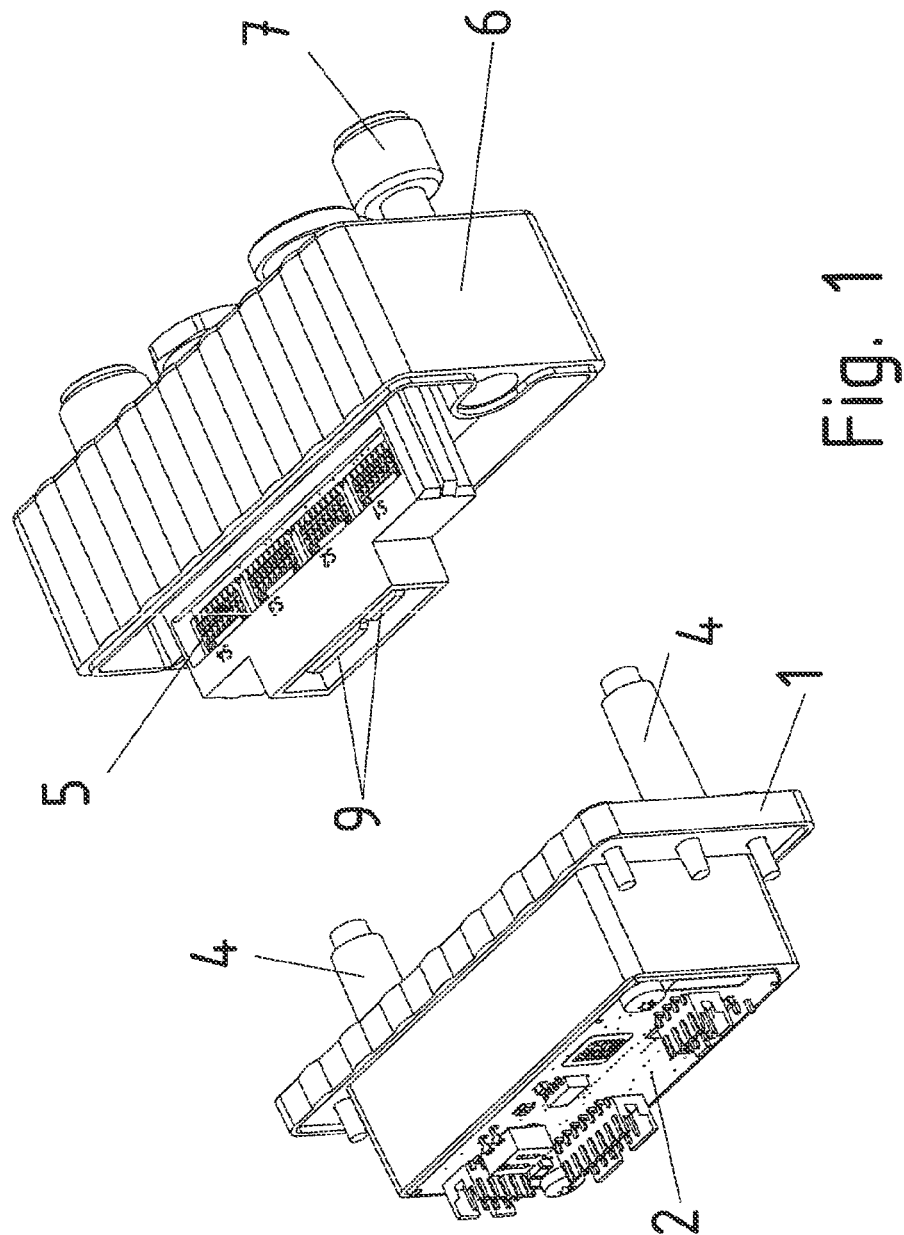

(51) Int. Cl.
*H01R 13/405* (2006.01)
*H05K 7/14* (2006.01)
*H05K 7/02* (2006.01)
*H02G 3/08* (2006.01)

(56) References Cited

U.S. PATENT DOCUMENTS

2006/0041328 A1 2/2006 McCormick
2009/0138693 A1* 5/2009 Chomik et al. .................. 713/1
2010/0290186 A1* 11/2010 Zeng et al. ..................... 361/694
2011/0127273 A1* 6/2011 Deane et al. ............... 220/592.2

OTHER PUBLICATIONS

International Preliminary Report on Patentability, issued in corresponding International Application No. PCT/EP2010/005899.

* cited by examiner

ELECTRICAL DEVICE

FIELD OF THE INVENTION

The present invention relates to an electrical device.

BACKGROUND INFORMATION

When working with electrical devices, it is generally known to design electronic circuits as bus nodes having addresses assigned thereto, so that data from a node addressed to an address are transmitted to that electronic circuit which has the address assigned thereto.

SUMMARY

Example embodiments of the present invention provide an electrical device that permits a simple and inexpensive servicing or initial operation thereof.

The electrical device, which is assembled from modules or includes assembled modules, has the following features: the modules each include an electronic circuit mounted on a respective heat sink, the modules being configured as nodes of a system bus that also leads to an electronic circuit designed as a node of the system bus; the electronic circuit being configured in a lower part that is configured in a recess of the housing of the electrical device; an upper part being detachably connectable to the lower part; a memory element being configured in the upper part, and data lines being routed via a plug connection to the electronic circuit to read out the memory element via the electronic circuit.

Upon replacement of the electrical device, in particular together with the lower part, a rapid initial operation is advantageously made possible, since the original fieldbus parameter, such as fieldbus address, baud rate and the like, of the replaced electrical device may be read out immediately following installation of the new electrical device, and used for the electrical device. In particular, there is no need for a readjustment. Moreover, the heat sink makes possible a compact, thus low-mass design of the electrical device. The replacement is hereby likewise facilitated. Moreover, the modular design also makes it possible to replace a defective module, thereby permitting a rapid and cost-effective servicing or a corresponding replacement.

The memory element may be arranged as an electronic memory element or as a mechanical memory, such as a DIP switch, etc. It is advantageous that a mechanical design allows a stable, rugged memory to be stored and read out, and an electronic and also mechanical design allow large volumes of data, thus not only the address, but also further parameters to be stored and read out, so that even the parameterization is able to be simply and quickly executed.

A node address of the electrical device for transmitting data in the fieldbus may be stored in the memory element. Here, the advantage is derived that the electronic components in the form of the remaining device are quickly and simply replaceable in the event of a fault. However, there is no need to interrupt the cabling of the fieldbus in the installation. Following insertion of the new electrical device, the new electrical device merely needs to read out and activate small amounts of data, such as the node address, baud rate, etc., and activate the same as a fieldbus node address. Immediately thereafter, the data may be exchanged via the fieldbus with other fieldbus nodes. A CAN bus, profibus or interbus protocol are preferably used as a fieldbus protocol.

Fieldbus drivers may be provided in the upper part, and/or a T-shaped cabling for the fieldbus may be provided in the upper part, in particular, fieldbus lines from the corresponding tapping point leading via the plug connection to the electronic circuit. A looping through of the bus lines in the upper part is advantageously made possible. Data may be coupled to or decoupled from the data bus via the tapping point. Except for the memory and, in some instances, the bus driver, no electronic components are provided in the upper part. In the same manner as the bus lines of the system bus and the fieldbus lines leading to the memory element, the supply lines for supplying the bus drivers are likewise interconnected via the plug connection from the upper part to the lower part. In addition, the supply lines for the electrical device may also be interconnected via the plug connection from the upper part to the lower part.

The upper part may include locating pins, in particular for preventing canting upon actuation of the plug connection to interconnect the fieldbus lines, in particular, into which connecting screws or also bayonet fittings may be screwed into place to connect the upper part to the lower part. This advantageously prevents a canting and thus a failure of the electrical connections of the bus lines. A safe and reliable initial operation is ensured by the secure interconnection of the bus lines.

One of the modules may feature a bus converter for converting data in the fieldbus protocol into data in the system bus protocol. The modules advantageously permit a rapid data exchange among themselves, since, in contrast to a commercially available fieldbus designed for very complex protocol structures, the system bus is a proprietary fieldbus and, thus, only includes the requisite elements.

The system bus may be designed, in particular, as a type of CAN bus, and the fieldbus, differing therefrom, is, in particular, a type of interbus, profibus, CAN bus, etc. An especially rapid data-transfer rate is advantageously attainable within the electrical device, since the system bus merely needs to meet the requirements of the proprietary devices, such as, for example, the electrical device and the modules included therein. Moreover, it is possible to reduce the requisite hardware outlay for manufacturing a system bus, since here, as well, only the requirements of the modules and/or of the electrical device need to be considered.

The modules, in particular the heat sinks of the modules may feature an interface at two mutually opposing sides that permits interconnection thereof in a line or row, thereby forming the bottom of the electrical device. A modular design is advantageously attainable, the heat of the components being able to be readily dissipated. Moreover, the interface is configured to allow the modules to also be rearranged within the line, the line length remaining unchanged.

Further features and aspects of example embodiments of the present invention are described in more detail below with reference to the appended Figures.

DETAILED DESCRIPTION

FIG. 1 shows a connector for an electrical device 35 according to an example embodiment of the present invention in an oblique view.

Figure 2:
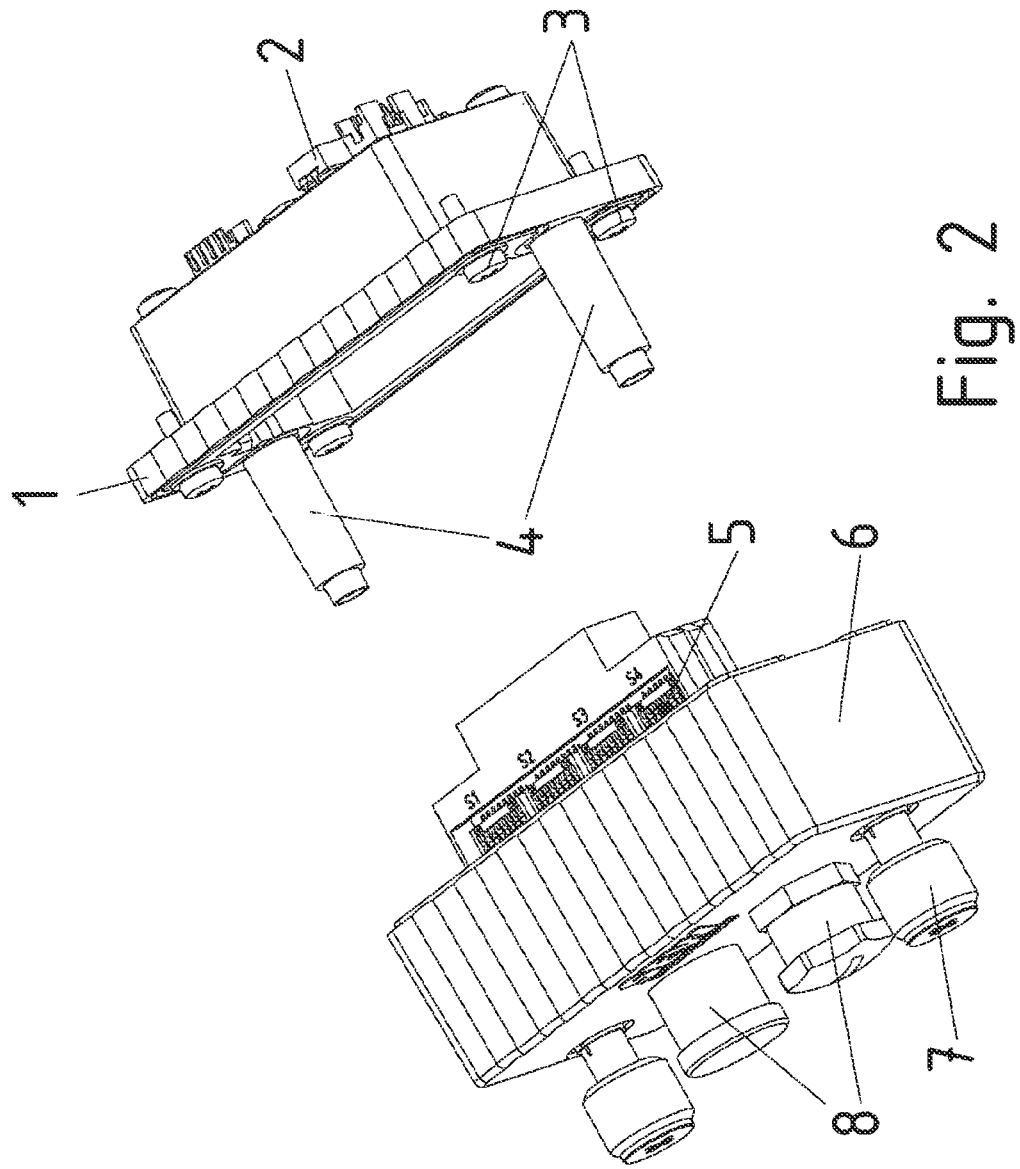

In FIG. 2, the connector is shown from another angle of view.

Figure 3:
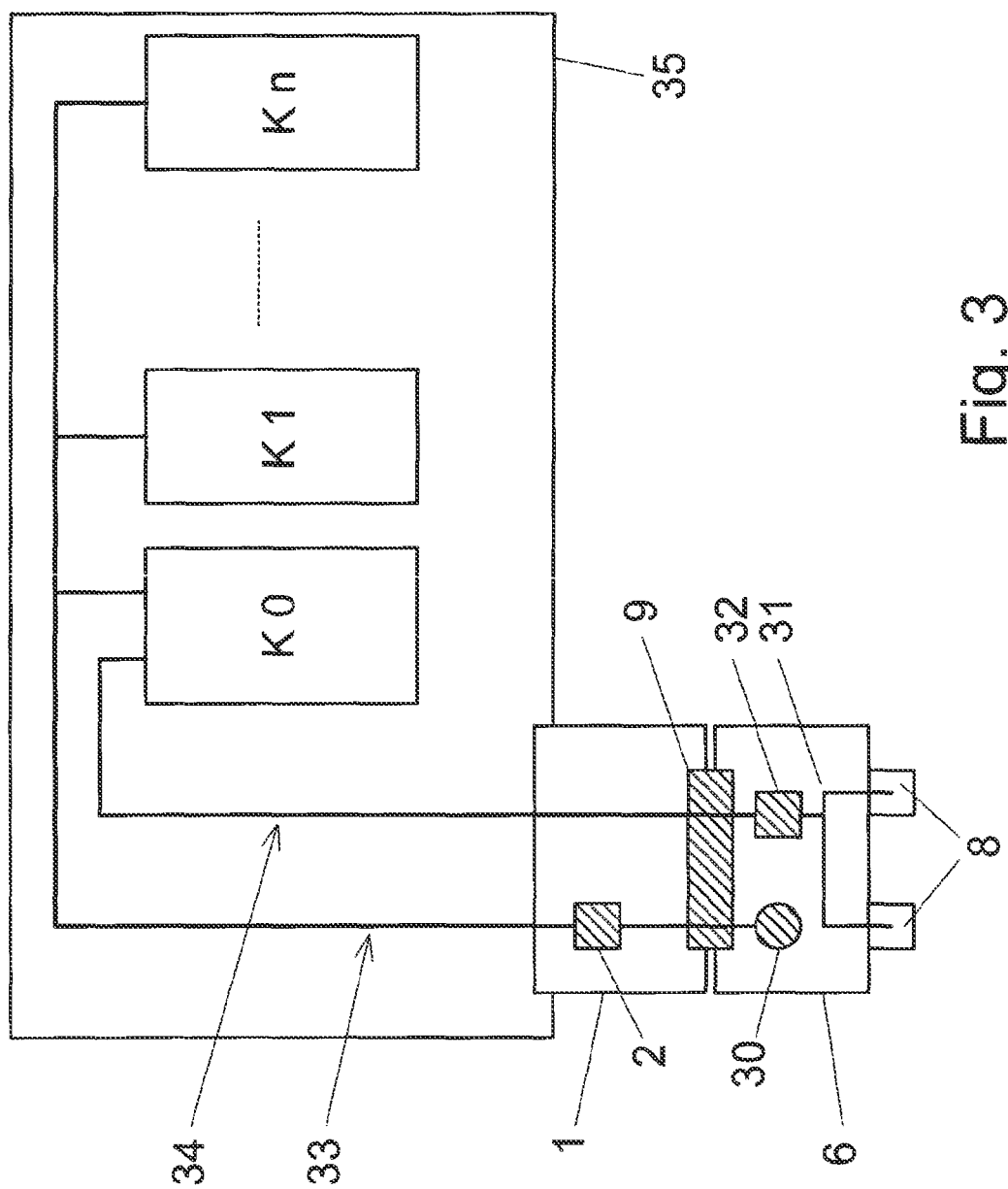

Electrical device 35 is schematically illustrated in FIG. 3.

Electrical device 35 includes modules K0, K1 through Kn, n being a whole number. Each module is configured on a respective base plate that functions as a heat sink and features cooling ribs. On two opposing sides, the base plates of the modules each feature a connection interface that allows impervious interconnection thereof in a row, thus in a line, the heat sinks forming the rear side of electrical device 35.

An electronic circuit having at least one system bus, thus connection for a data bus, is configured on the base plate of each module. The functionalities of the electronic circuits are arranged exemplarily by a supply module, inverter, converter, regenerative feedback module, control unit, etc. The rear side formed by the heat sinks is supplemented by further housing parts to form a housing that surrounds the electronic circuit while providing a high degree of protection. Thus, due to the modular configuration thereof, the electrical device may be used in decentralized fashion and is adaptable in the functionality thereof to the particular local requirements. The heat sink ensures a sufficient dissipation of heat to the ambient environment.

The supply lines and/or further fieldbus lines are routed via a connector part. The connector part has a lower part and an upper part, lower part 1 having a flange part design allowing insertion thereof into a recess of electrical device 35 and impervious connection thereof.

Upper part 6 is fastened by connecting screws 7 to lower part 1, locating pins 4 on lower part 1 being provided for connecting upper part 6 and lower part 1, preventing a canting upon joining together of the upper part and lower part 1. A very simply and rapid replacement is rendered possible when a screw connection is provided without the use of tools, such as knurled-head screws.

A circuit board 2 having signal electronics, arranged as a node of system bus 33, is provided on lower part 1. Lower part 1 is fastened by fixing screws 3 to the housing of electrical device 35.

Upper part 6 features DIP switches 5, which, as mechanical memories of data, such as bus node address of electrical device 35, for example, are provided for the further fieldbus or further data. Data lines from this mechanical memory, thus DIP switch 5, to electronic circuit provided on circuit board 2, are routed via a connector from upper part 6 to lower part 1. One of connector parts 9 is shown in FIG. 1. Mating connector part is not visible, but is provided on lower part 1.

At plug connections, encompassing cable lead-throughs 8, bus lines are led out, respectively introduced into upper part 6, thereby rendering possible a looping through of the bus lines, and a tapping point being realized at further fieldbus by a T-shaped cabling 31 within upper part 6. These bus lines ending at the tapping point are also routed via the contacts of connector part 9 to lower part 1 and, from there, further to a first module K0 featuring a bus converter, so that the data of the further fieldbus may be converted into data that are transmissible on the system bus.

In the event of failure of the electrical device or required maintenance thereof, it may be reconnected or replaced, upper part 6 remaining unchanged in the system—as also the lines, in particular fieldbus lines leading to upper part 6. Thus, the fieldbus system of the installation is able to continue to function, uninterrupted, even when the electrical device is disconnected. Upon connection to upper part 6 and initial operation of electrical device 35, the address stored in memory element 30 of the upper part is read out via system bus 33 and the electronic circuit provided on circuit board 2. Thus, the address and further parameters are immediately available, and the electrical device is ready to exchange data via further fieldbus 34.

In FIGS. 1 and 2, memory element 30 is designed as a mechanical memory in the form of a DIP switch 5. Other variants of the memory element, such as an electronic memory element, may also be advantageously used in other exemplary embodiments. However, as is apparent in FIG. 3, it is important that memory element 30 be able to be read out via the electronic circuit of circuit board 2 and that these data be able to be further transported via the system bus, in particular to the modules designed as system bus nodes.

Data may be exchanged among the individual modules via system bus 33. Moreover, system bus 33 is connected to a memory element 30 provided in the upper part of the connector, so that the data stored therein may be read out. A bus node address provided for the electrical device for participating in the further data bus and/or further parameters are provided as data, for example.

System bus 33 differs from further fieldbus 34 in the transmission protocol and in the data-transfer rate. Apart from that, system bus 33 and further fieldbus 34 are each designed as a data bus.

In upper part 6, fieldbus drivers 32 are provided at the tapping point. However, they may also be alternatively provided in lower part 1, in particular in the electronic circuit provided on circuit board 2 or within electrical device 35.

The signal electronics provided on circuit board 2 may be designed, in turn, as a node of the system bus, memory element 30 being connectable, however, via the contacts of connector part 9 and being able to be read out therefrom. No system bus connection is provided between memory element 30 and the electronic circuit on circuit board 2. The electronic circuit analyzes the voltage states present at the contacts in order to record the information of the memory contents of memory element 30.

LIST OF REFERENCE NUMERALS 1 flange part of the lower part
2 circuit board having signal electronics
3 fixing screws
4 locating pin
5 DIP switch
6 upper part
7 connecting screws
8 plug connection including cable lead-through
9 contacts of the connector part
30 memory element, in particular electronic memory or mechanical memory
31 T-distributor for the fieldbus
32 fieldbus driver
33 system bus
34 fieldbus
35 electrical device

What is claimed is:

1. An electrical device, comprising
a housing including a plurality of modules, each module including an electronic circuit mounted on a respective heat sink;
a further electronic circuit;
a system bus connecting each of the modules and the further electronic circuit as nodes of the system bus;
a memory element storing a node address of the electrical device and connected to the further electronic circuit on the system bus;
a fieldbus separate from the system bus and connected to one of the modules; and
a connector connected to the housing and including a lower part and an upper part that is detachably connected to the lower part, wherein—the electronic circuit is arranged in the lower part, the lower part is arranged in a recess of the housing of the electrical device;
the memory element is arranged in the upper part; the electrical device obtains the node address by the further electronic circuit reading the node address from the memory element and supplying the node address to the modules, the electrical device communicates data with a further fieldbus via the fieldbus connected to the one of the modules, and the housing, including the modules, and the lower part of the connector are detachable from the upper part of the connector while the upper part remains in communication with the further fieldbus; and the electrical device further comprising fieldbus drivers provided in the upper part, a T-shaped cabling for the fieldbus provided in the upper part, and/or fieldbus lines leading from the further fieldbus to the upper part and leading from a corresponding tapping point via the plug connection to the one of the modules connected to the fieldbus.

2. The electrical device according to claim 1, wherein the memory element is arranged as an electronic memory element, a mechanical memory, and/or a DIP switch.

3. The electrical device according to claim 1, wherein the upper part includes locating pins adapted to prevent canting upon actuation of the plug connection to interconnect the fieldbus lines, and into which connecting screws are screwable into place to connect the upper part to the lower part.

4. The electrical device according to claim 3, wherein the one of the modules connected to the field bus includes a bus converter adapted to convert data in a fieldbus protocol into data in a system bus protocol.

5. The electrical device according to claim 1, wherein the system bus is arranged as a CAN bus, and the fieldbus, is arranged as an interbus, a profibus, and/or a CAN bus.

6. The electrical device according to claim 1, wherein the modules and/or the heat sinks of the modules include an interface at two mutually opposing sides that allows them to be interconnected in a line or a row and thereby form a bottom of the electrical device.

\* \* \* \* \*